United States Patent [19]

Arai

[11] Patent Number: 5,184,536
[45] Date of Patent: Feb. 9, 1993

[54] SWASH PLATE TYPE PISTON PUMP/MOTOR

[75] Inventor: Mitsuru Arai, Kawasaki, Japan

[73] Assignee: Kabushiki Kaisha Komatsu Seisakusho, Japan

[21] Appl. No.: 721,556

[22] PCT Filed: Nov. 21, 1990

[86] PCT No.: PCT/JP90/01523
§ 371 Date: Jul. 12, 1991
§ 102(e) Date: Jul. 12, 1991

[87] PCT Pub. No.: WO91/07590
PCT Pub. Date: May 30, 1991

[30] Foreign Application Priority Data

Nov. 22, 1989 [JP] Japan .................. 1-301822

[51] Int. Cl.$^5$ ............................. F01B 13/04; F04B 1/26
[52] U.S. Cl. ................................. 91/505; 91/504; 91/506; 92/12.2; 417/222.1
[58] Field of Search ............. 91/504, 505, 506; 92/12.2; 417/222 R

[56] References Cited

U.S. PATENT DOCUMENTS

| | | | |
|---|---|---|---|
| 2,604,047 | 7/1952 | Beaman et al. | 417/206 |
| 3,139,037 | 6/1964 | Budzich | 91/505 |
| 3,412,447 | 11/1968 | Summerfield | 92/12.2 |
| 3,935,796 | 2/1976 | Wood | 92/12.2 |
| 4,223,594 | 9/1980 | Gherner | 91/504 |
| 4,581,980 | 4/1986 | Berthold | 92/12.2 |
| 4,934,253 | 6/1990 | Berthold | 91/506 |

FOREIGN PATENT DOCUMENTS

| | | |
|---|---|---|
| 8423061 | 8/1986 | Fed. Rep. of Germany. |
| 1357561 | 5/1963 | France ......... 91/505 |
| 59-79078 | 5/1984 | Japan. |
| 59-113274 | 6/1984 | Japan. |

OTHER PUBLICATIONS

Patent Abstract of Japan, vol. 8, No. 189 (M-321) (1626), Aug. 30, 1984, For: Variable Type Hydraulic Actuator.

*Primary Examiner*—Richard A. Bertsch
*Assistant Examiner*—Peter Korytnyk
*Attorney, Agent, or Firm*—Ronald P. Kanenen

[57] ABSTRACT

The present invention has for its object to provide a swash plate type piston pump/motor which is simple in construction and small in size and which enables a swash plate to be tilted surely. The swash type piston pump/motor is arranged such that a swash plate receiving surface (1) formed in a housing (1) is inclined by a predetermined angle relative to the axis (2) of a rotating shaft (2) so that even when the angle of tilting of the swash plate is increased the distance from the axis of the rotation shaft to the center (12) of a ball (12) which serves as the center of swing of the swash plate can be reduced.

5 Claims, 3 Drawing Sheets

SWASH PLATE TYPE PISTON PUMP/MOTOR

TECHNICAL FIELD OF THE INVENTION

This invention relates to a swash plate type piston pump/motor, and more particularly to an apparatus for varying the angle of tilting of a swash plate thereof.

BACKGROUND ART OF THE INVENTION

A swash plate type piston pump/motor comprises, as shown in FIG. 3, for example, a cylinder block 3 mounted in a housing 1 so as to rotate freely together with a rotating shaft 2, and a plurality of pistons 5 slidably inserted in a plurality of cylinder holes 4 formed in the cylinder block 3 so as to define a plurality of cylinder chambers 6, the arrangement being made such that each of these pistons 5 is reciprocated in each of the cylinder holes 4 by slidably moving each of the pistons 5 along the front surface 7a of a swash plate 7 so as to increase and decrease the volume of each of the cylinder chambers 6, and the displacement of piston pump/motor is determined by the stroke of reciprocation of the pistons 5, and in order to increase the displacement, the angle of tilting of the swash plate 7 is varied so as to increase the stroke of reciprocation of each piston 5.

As examples of the apparatus for varying the angle of tilting of the swash plate 7, there are heretofore known an apparatus wherein the semi-circular surface 7b (in sectional view) of a swash plate 7 is swingable along a semi-circular recess 8a formed in a cradle 8, and the swash plate 7 is swung by adjusting pistons 9 along the cradle 8, as shown in FIG. 3, and an apparatus as shown in FIG. 4 wherein a swash plate 7 has a first contact surface 10 and a second contact surface 11 formed on the rear surface 7c thereof, and a ball 12 is provided over a swash plate receiving surface 1a of a housing 1 and the boundary portion between the first and second contact surfaces, the arrangement being made such that when the swash plate 7 is swung by an adjusting piston 13 around the ball 12, the first and second contact surfaces 10 and 11 are brought into contact with the swash plate receiving surface 1a to vary the angle of tilting of the swash plate 7.

The former apparatus is complicated in construction and has slidably movable parts which offer a high resistance to sliding movement, and so its operation is liable to become unreliable, whilst the latter apparatus is simple in construction, but the angle of tilting angle of the swash plate cannot be increased to a large extent, and if the angle of tilting of swash plate is increased appreciably, the overall size of the piston/pump motor assembly becomes large.

Stating in brief, since the swash plate receiving surface 1a intersects the axis 2a of the rotating shaft 2 at right angles, when the first contact surface 10 or the second contact surface 11 is brought into contact with the swash plate receiving surface 1a, either one of these contact surfaces intersects the shaft 2 at right angles. Thus, if the angle of tilting $\theta$ of the swash plate is increased, then the center 12a of the ball 12 will move away from the front surface 7a of the swash plate 7, i.e., the surface on which the pistons 5 are allowed to slidably move, so that the amount of eccentiricity $L_2$ from the axis 2a of the rotating shaft 2 to the center 12a of the ball 12 will increase, and the point of action of the resultant force Fp of forces exerted by the pistons 5 will deviate a little due to rotation of the swash plate 7. Therefore, the position of the center 12a of the ball 12 must be decided taking into account the amount of deviation $L_1$.

If the distance between the center 12a of the ball 12 and the axis 2a of the rotating shaft 2 is increased, then it is necessary to increase the swinging force of the swash plate 7 caused by the adjusting piston 13. To stabilize the swash plate 7, it is necessary to increase the distance from the center 12a of the ball 12 to the end 11a of the second contact surface 11 to thereby support the swash plate 7 so as to prevent it from turning over due to the thrust exerted by the adjusting pistion 13. As a result, the length $L_3$ from the center 2a of the rotating shaft 2 to the end of the swash plate 7 becomes longer so that the size of the housing 1 becomes bigger correspondingly, thus increasing the overall size of the piston pump/motor.

SUMMARY OF THE INVENTION

The present invention has been made in view of the above-mentioned circumstances, and has for its object to provide an apparatus for varying the angle of tilting of a swash plate of a swash plate type piston pump/motor which is simple in construction and smaller in size and which enables tilting operation of the swash plate to be made surely.

To achieve the above-mentioned object, according to an aspect of the present invention, there is provided a swash plate type piston pump/motor comprising: a cylinder block mounted within a housing so as to rotate freely together with a rotating shaft; a plurality of pistons slidably inserted in a plurality of cylinder holes formed in the cylinder block in parallel with the rotating shaft so as to define a plurality of cylinder bores; and a swash plate for holding the base ends of these pistons in such a way as to allow the base ends to slidably move freely along a slanting surface formed in the front surface thereof, the swash plate having a first contact surface and a second contact surface formed on the rear surface thereof so as to intersect at a predetermined angle, the swash plate being held within the housing so as to swing freely through at least one ball provided between the corners of boundary between these two contact surfaces and a swash plate receiving surface formed in the housing, characterized in that the swash plate receiving surface is inclined by a predetermined angle relative to the axis of the rotating shaft.

In the above-mentioned aspect, the swash plate is held in the housing so as to swing freely relative to the housing through the intermediary of two balls provided between the corners of boundary between the two contact surfaces and the swash plate receiving surface.

In the apparatus for varying the angle of tilting of a swash plate according to the present invention, the swash plate receiving surface formed in the housing is inclined by a predetermined angle relative to the axis of the rotating shaft so that even when the angle of tilting of the swash plate is increased the distance from the axis of rotating shaft to the center of the ball which serves as the center of swing of the swash plate can be reduced.

Thus, according to the present invention, the angle of tilting of the swash plate is varied by swinging the swash plate about the center of the ball by the adjusting piston, and therefore the construction of the piston pump/motor becomes simple, and its resistance to sliding is reduced, and also its operational reliability is enhanced.

Further, since the swash plate receiving surface is inclined relative to the axis of the rotating shaft, even when the angle of tilting θ of the swash plate is increased, the distance from the axis of the rotating shaft to the outer peripheral end of the swash plate can be reduced so that the size of the housing can be reduced, thus reducing the overall size of the swash plate type pump/motor.

Stating in brief, the displacement of working fluid by the motor can be increased by using the apparatus for varying the angle of tilting of a swash plate having a simple construction without increasing the overall configuration piston pump/motor.

The above-mentioned and other objects, aspects and advantages of the present invention will become apparent to those skilled in the art by making reference to the following description and the accompanying drawings in which a preferred embodiment incorporating the principles of the present invention is shown by way of example only.

DETAILED DESCRIPTION OF A PREFERRED EMBODIMENT

The present invention will now be described below in detail by way of a preferred embodiment with reference to the accompanying drawings. (FIGS. 1 and 2)

Figure 1:
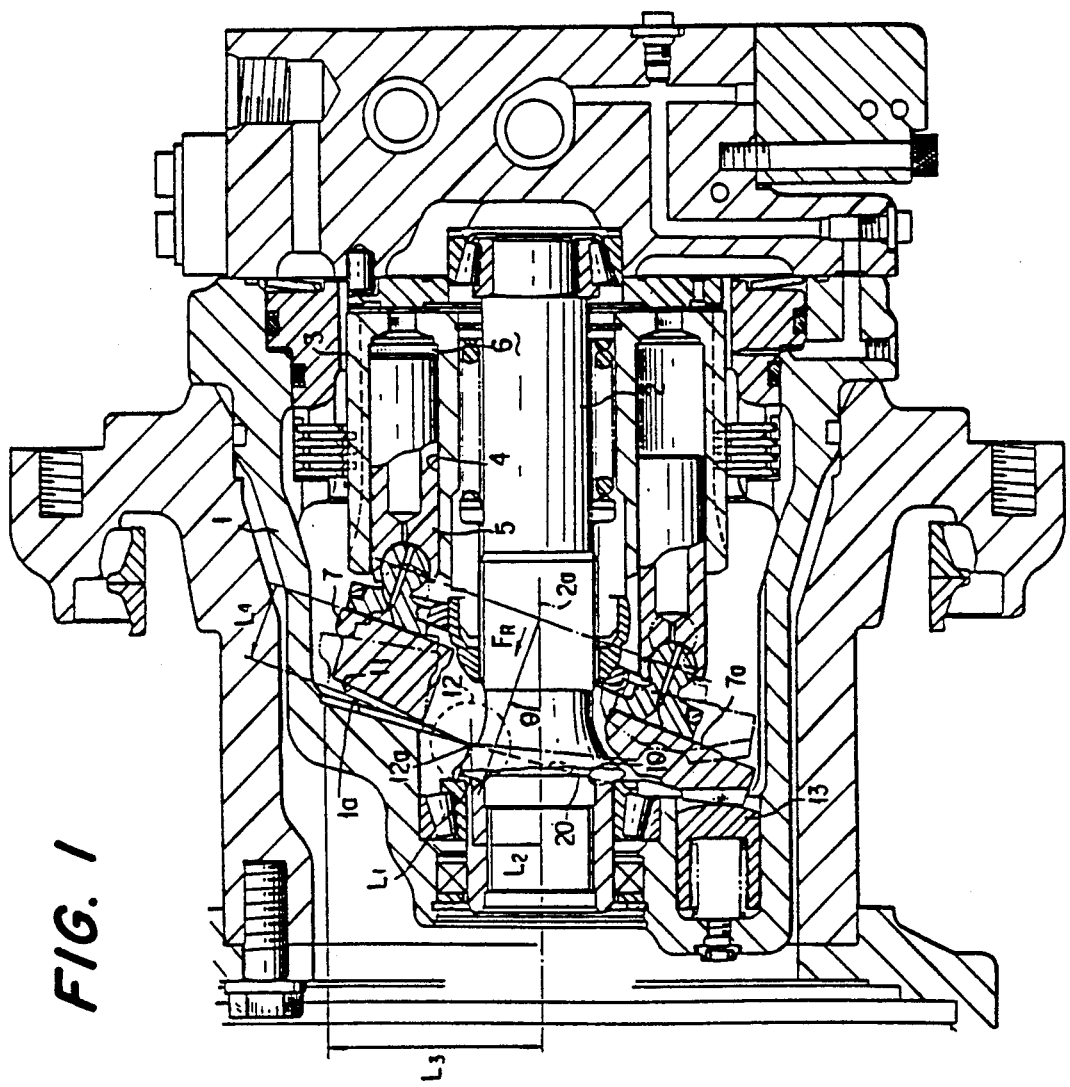
FIG. 1 is an overall, schematic sectional view showing an embodiment of the present invention.
Figure 2:
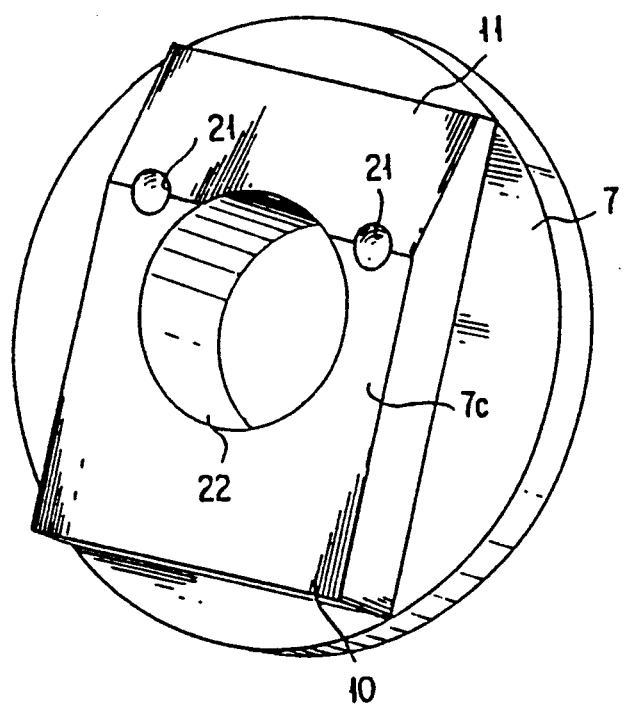
FIG. 2 is a perspective view showing the rear surface of a swash plate used in the embodiment of the present invention.
Figure 3:
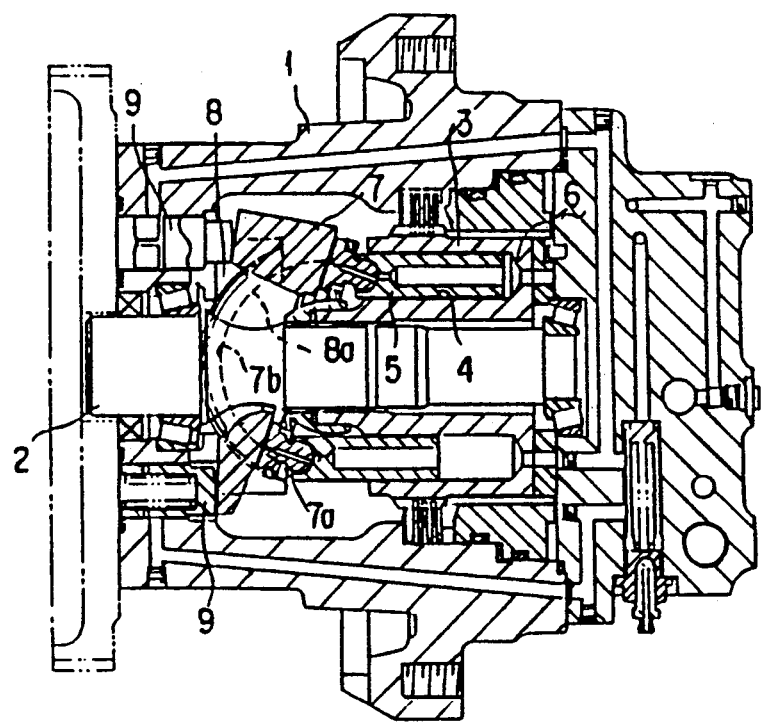
FIGS. 3 and 4 are schematic sectional views, respectively, showing prior art examples.
Figure 4:
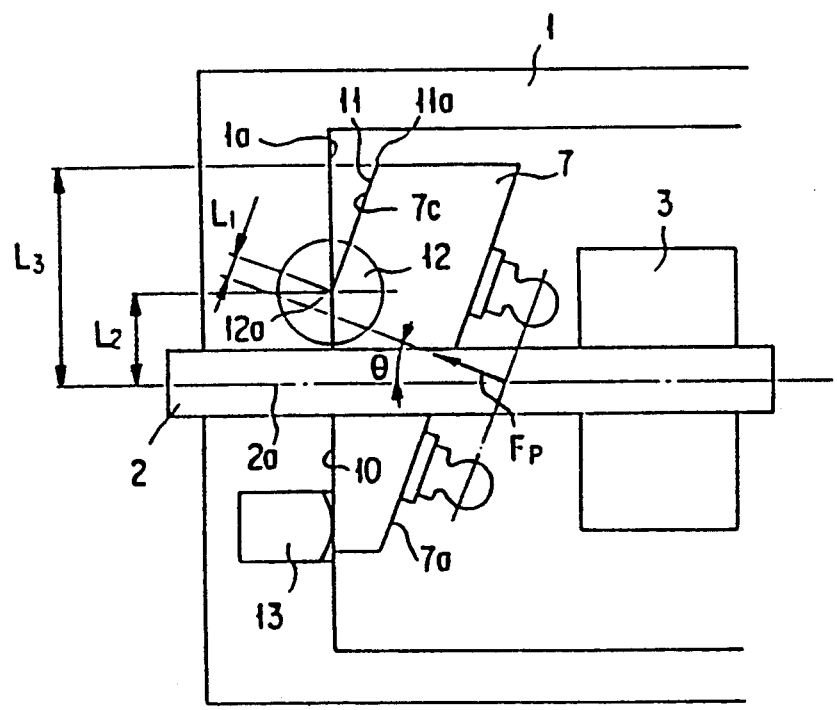

As shown in FIGS. 1 and 2, a swash plate receiving surface 1a of a housing 1 is inclined by a predetermined angle relative to the axis 2a of a rotating shaft 2.

Since the distance L4 between the center 12a of a ball 12 and the front surface 7a of a swash plate 7 and the sliding surface of each of pistons 5 can be set thereby at a small value, the amount of eccentricity $L_2$ between the center 12a of the ball 12 and the axis 2a of the rotating shaft 2 can be reduced, and even when the angle of tilting θ of the swash plate 7 is increased, the point of action of a resultant force Fp of forces exerted by the pistons 5 can be located at a position in which a deviational dimension $L_1$ of the resultant force from the center 12a of the ball 12 is taken into account.

Therefore, the angle of tilting of the swash plate caused by the thrust of the adjusting piston 13 can be reduced, and also the distance $L_3$ between the axis 2a of the rotating shaft 2 and the extreme end of the swash plate 7 can be reduced, and as a result, the overall dimension of the swash plate type piston pump/motor can be reduced.

Further, as is clear from FIG. 2, the swash plate 7 has a rear surface 7c on which a first contact surface 10 and a second contact surface 11 are formed so as to intersect at a predetermined angle, and ball mounting recesses 21 are formed in the corner of boundary between the first and second contact surfaces 10 and 11. Further, a hole 22 for insertion of the rotating shaft 2 is formed in the central part of the swash plate 7.

What is claimed is:

1. A swash plate type piston pump/motor comprising: a housing having a swash plate receiving surface; a rotating shaft having an axis; a cylinder block mounted within the housing so as to rotate freely together with the rotating shaft; a plurality of pistons slidably inserted in a plurality of cylinder holes formed in the cylinder block in parallel with said rotating shaft so as to define a plurality of cylinder chambers; and a swash plate for holding respective base ends of the pistons in such a way as to allow the base ends to slidably move freely along a slanting surface formed in a front surface of said swash plate, the swash plate having a first contact surface and a second contact surface formed on a rear surface of said swash plate so as to intersect with each other at a predetermined angle, said swash plate being held within said housing so as to swing freely through an intermediary of at least one ball provided between the corner defined by the boundary between the first and second contact surfaces and said swash plate receiving surface, characterized in that said swash plate receiving surface is inclined by a predetermined oblique angle relative to the axis of said rotating shaft.

2. A swash plate type piston pump/motor as claimed in claim 1, characterized in that said swash plate is held within the housing so as to swing freely relative to said housing through an intermediary of two balls provided between said corner defined by the boundary between the first and second contact surfaces and the swash plate receiving surface.

3. A swash plate type piston pump/motor comprising: a housing having a swash plate receiving surface; a rotary shaft having an axis; a cylinder block mounted within the housing so as to rotate freely together with the rotating shaft; a plurality of pistons slidably inserted in a plurality of cylinder holes formed in the cylinder block in parallel with said rotating shaft so as to define a plurality of cylinder chambers; and a swash plate for holding respective base ends of the pistons in such a way as to allow the base ends to slidably move freely along a slanting surface formed in a front surface of said swash plate, the swash plate having a first contact surface and a second contact surface formed on a rear surface of said swash plate so as to intersect with each other at a predetermined angle, said swash plate being held within said housing so as to swing freely between first and second pivot limits through an intermediary of at least one ball provided between a corner defined by the intersection of the first and second contact surfaces and said swash plate receiving surface such that said first contact surface contacts said swash plate receiving surface at said first pivot limit and said second contact surface contacts said swash plate receiving surface at said second pivot limit, characterized in that said swash plate receiving surface is inclined by a predetermined angle relative to the axis of said rotating shaft.

4. The swash plate type piston pump/motor as claimed in claim 3, characterized in that said swash plate is held within the housing so as to swing freely relative to said housing through an intermediary of two balls provided between opposing ends of a corner defined by an intersection of the first and second contact surfaces and the swash plate receiving surface.

5. The swash plate type piston pump/motor of claim 4, wherein the first contact surface, the second contact surface and the swash plate receiving surface are substantially planar.

* * * * *